United States Patent [19]
Sakura

[11] Patent Number: 5,763,143
[45] Date of Patent: Jun. 9, 1998

[54] PROCESS OF EXACTLY PATTERNING LAYER TO TARGET CONFIGURATION BY USING PHOTO-RESIST MASK FORMED WITH DUMMY PATTERN

[75] Inventor: Naoki Sakura, Tokyo, Japan

[73] Assignee: NEC Corporation, Tokyo, Japan

[21] Appl. No.: 571,535

[22] Filed: Dec. 13, 1995

[30] Foreign Application Priority Data

Dec. 28, 1994 [JP] Japan ................................. 6-327512

[51] Int. Cl.$^6$ ................................................. G03C 5/00
[52] U.S. Cl. ................................. 430/330; 430/5; 430/313
[58] Field of Search ................................. 430/330, 5, 313

[56] References Cited

U.S. PATENT DOCUMENTS 5,032,890 7/1991 Ushiku et al. ........................ 357/41
5,459,093 10/1995 Kuroda et al. ...................... 437/51

Primary Examiner—Mark Chapman
Attorney, Agent, or Firm—Whitham, Curtis & Whitham

[57] ABSTRACT

Tension takes place in a surface of a photo-resist mask due to a shrinkage in a post-development bake, and a recess formed in the photo-resist mask takes up the tension so as to maintain the adhesion to a semiconductor substrate and prevent a resist pattern from undesirable deformation.

9 Claims, 9 Drawing Sheets

PROCESS OF EXACTLY PATTERNING
LAYER TO TARGET CONFIGURATION BY
USING PHOTO-RESIST MASK FORMED
WITH DUMMY PATTERN

FIELD OF THE INVENTION

This invention relates to a lithography used in a process of fabricating a semiconductor device and, more particularly, to a process of exactly patterning a layer to a target configuration.

DESCRIPTION OF THE RELATED ART

A lithography is used in a fabrication process of a semiconductor device for forming a miniature pattern on or over a semiconductor substrate. The lithography is involved in various patterning processes, and FIGS. 1A to 1E illustrate one of the prior art patterning processes.

The prior art patterning process forms grooves 1 in a semiconductor substrate 2. First, a positive photo-resist solution is dropped on a surface of the semiconductor substrate 2, and is spread over the surface. The positive photo-resist thus spread over the surface is subjected to a pre-exposure bake, and the surface of the semiconductor substrate 2 is covered with a positive photo-resist layer 3 of 1 micron thick as shown in FIG. 1A.

The semiconductor substrate 2 is set in an aligner (not shown), and a photo-mask 4 is moved into an optical path in the aligner. The photo-mask 4 has a non-transparent portion 4a patterned on a glass plate 4b, and the non-transparent portion 4a forms a mask pattern. Light is radiated through the photo-mask 4 to the photo-resist layer 3 as shown in FIG. 1B, which renders the photo-resist layer 3 partially soluble, by which means the mask pattern is transferred onto the photo-resist layer 3.

The photo-resist layer 3 is developed, and is thereafter dried. A photo-resist mask 3a is formed from the photo-resist layer 3 as shown in FIG. 1C, and the pattern of the photo-resist mask 3a is similar to the photo-mask pattern. The semiconductor substrate 2 is partially uncovered with the photo-resist mask 3a, and, accordingly, is partially exposed to slits defined by the photo-resist mask 3a.

Subsequently, the photo-resist mask 3a is subjected to a post-development bake at 100 degrees centigrade so as to enhance the adhesion between the photo-resist mask 3a and the semiconductor substrate 2. Since it is necessary for the photo-resist mask 3a to withstand the next etching, the post-development bake is indispensable. However, the photo-resist shrinks during the post-development bake, and the photo-resist mask 3a is deformed as shown in FIG. 1D.

The semiconductor substrate 2 is then placed in a wet etching system, and an etchant isotropically removes the semiconductor substance exposed thereto as shown in FIG. 1E. The photo-resist mask 3a is then stripped off from the semiconductor substrate 2, and the grooves 1 are formed in the surface portion of the semiconductor substrate 2.

FIGS. 2A to 2F illustrate another prior art patterning process, which forms a metallic pattern 11 on a semiconductor substrate 13.

First, a platinum layer 13 is deposited to a 2000 angstrom thickness on a surface of the semiconductor substrate 12. Subsequently, a positive photo-resist solution is dropped on a surface of the platinum layer 13, and is spread over the surface of the platinum layer 13. The positive photo-resist thus spread over the surface is subjected to a pre-exposure bake, and the surface of the semiconductor substrate 2 is covered with a positive photo-resist layer 14 of 2.5 micron thick as shown in FIG. 2A.

The semiconductor substrate 12 is then set in an aligner (not shown), and a photo-mask 15 is moved into an optical path in the aligner. The photo-mask 15 has a non-transparent portion 15a patterned on a glass plate 15b, and the non-transparent portion 15a forms a mask pattern. Light is radiated through the photo-mask 15 to the photo-resist layer 14 as shown in FIG. 2B, which renders photo-resist layer 14 partially soluble, by which means the mask pattern is transferred onto the photo-resist layer 14, i.e., the non-soluble portion forms a resist pattern similar to the photo-mask pattern.

The photo-resist layer 14 is developed, and is thereafter dried. A photo-resist mask 15a is formed from the photo-resist layer 15 as shown in FIG. 2C, and the pattern of the photo-resist mask 15a is similar to the photo-mask pattern. The platinum layer 13 is partially uncovered with the photo-resist mask 15a, and is partially exposed to slits defined by the photo-resist mask 15a.

Subsequently, the photo-resist mask 15a is subjected to a post-development bake at 100 degrees centigrade so as to enhance the adhesion between the photo-resist mask 15a and the platinum layer 13. The post-development bake is indispensable, similar to the first prior art patterning process. However, the photo-resist shrinks during the post-development bake, and the photo-resist mask 15a is deformed as shown in FIG. 2D.

Using the photo-resist mask 15a, gold is deposited to a 2 micron thickness over the exposed surface of the platinum layer 13 through an electroplating, and gold columns 16 rise from the exposed surface of the platinum layer 13 as shown in FIG. 2E.

Subsequently, the photo-resist mask 15a is stripped off, and the platinum layer 13 and the gold columns 16 are subjected to an ion milling. The platinum layer 13 and the gold columns 16 are partially removed, and the gold columns 16a, 16b and 16c on the platinum strips 13a, 13b and 13c are electrically isolated from one another. The gold columns 16a to 16c and the platinum strips 13a to 13c as a whole constitute the metallic pattern 11, and the semiconductor substrate 12 is exposed to the gaps among the platinum strips 13a to 13c as shown in FIG. 2F.

A problem is encountered in the first and second prior art patterning processes in that the actual pattern width is substantially different from the intended pattern width. In detail, the wet etching laterally proceeds beneath the photo-resist mask 3a, and the side etching causes the actual pattern width to be greater than the intended pattern width. On the other hand, the electroplating tailors the outer configuration of the rightmost piece of gold 16 along the deformed surface of the photo-resist mask 15a, and forms a projecting, or overhung portion. The overhung portion does not allow the ion beam to reach the platinum layer 13 thereunder, and the platinum strip 13c becomes wider than the other platinum strips 13a and 13b. Moreover, the overhung portion causes the conductive substances 17 to be deposited on the side surface of the gold column 16c, and the gold column 16c becomes wider than the other gold columns 16a and 16b.

Thus, the prior art patterning processes do not exactly transfer the mask patterns to the target layers, and may not accurately form a miniature pattern on or over the semiconductor substrate.

SUMMARY OF THE INVENTION

It is therefore an important object of the present invention to provide a process of patterning a layer into a configuration close to an intended configuration.

The present inventor studied the problem inherent in the prior art, and noticed that the shrinkage not only deformed the outer configuration of the photo-resist mask but also decreased the adhesion between the periphery of the photo-resist mask and the semiconductor substrate. The weak adhesion allows the wet etching to proceed beneath the photo-resist mask, and the deformation was the causation of the overhung portion.

To accomplish the object, the present invention proposes to relieve internal stress due to the photo-resist shrinkage.

In accordance with the present invention, there is provided a process of patterning a layer to a configuration, comprising the steps of: a) preparing a resist layer; b) transferring a mask pattern to the resist layer, the mask pattern having a main pattern image for forming the configuration and a dummy, or stress-relief pattern image for forming at least one stress-relief recess in the resist layer; c) developing the main pattern image and the dummy pattern image in the resist layer so as to form the resist layer into a resist mask having the at least one recess; d) baking the resist mask so as to increase an adhesion; and e) forming a layer into the configuration by using the resist mask.

BRIEF DESCRIPTION OF THE DRAWINGS

The features and advantages of the process of patterning a layer into a configuration according to the present invention will be more clearly understood from the following description taken in conjunction with the accompanying drawings in which.

DESCRIPTION OF THE PREFERRED EMBODIMENTS

First Embodiment

FIGS. 3A to 3F illustrate a process of patterning a layer to a configuration according to the present invention. The process forms grooves 21 arranged in parallel to one another in a surface portion of a semiconductor substrate 22, and the grooves 21 are 1 micron in width.

Figure 1A:
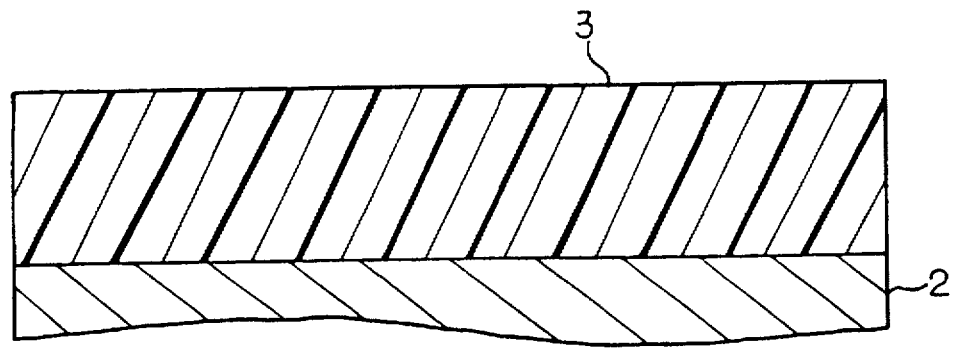
FIGS. 1A to 1E are cross sectional views showing the first prior art process sequence for patterning the semiconductor substrate.
Figure 1B:
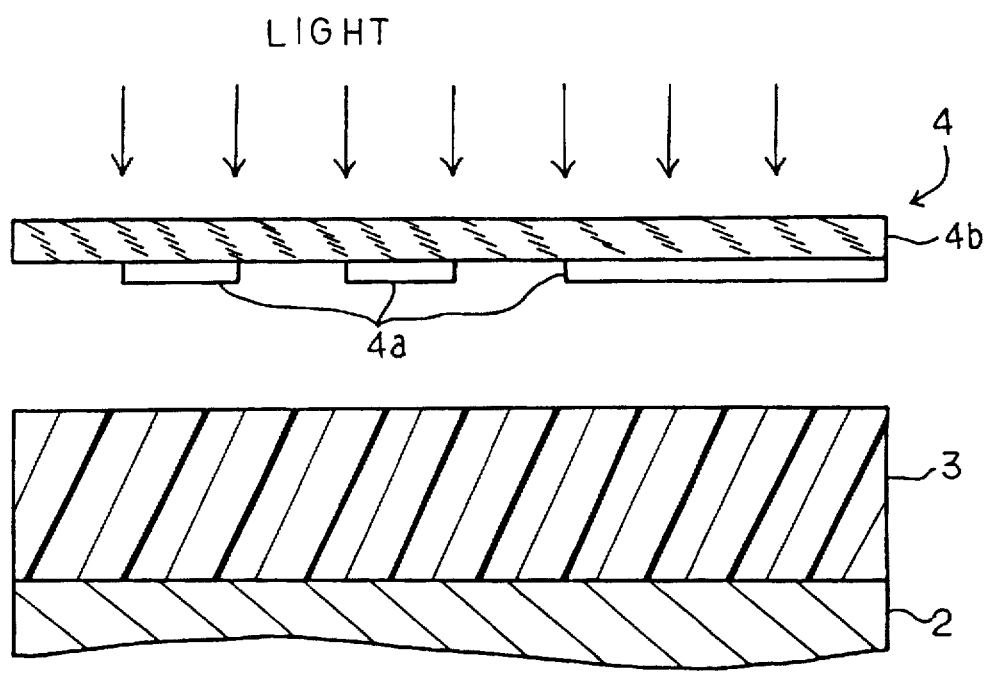
Figure 1C:
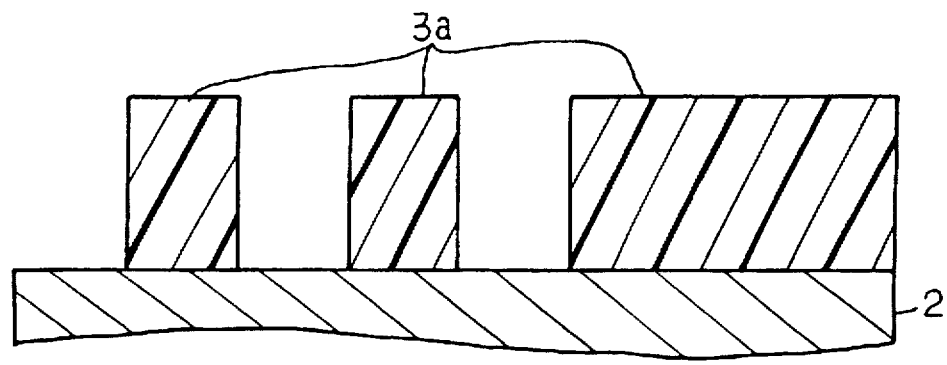
Figure 1D:
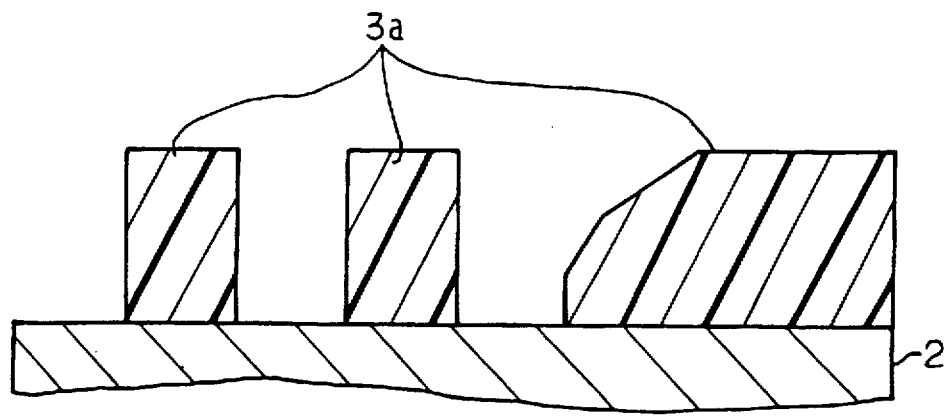
Figure 1E:
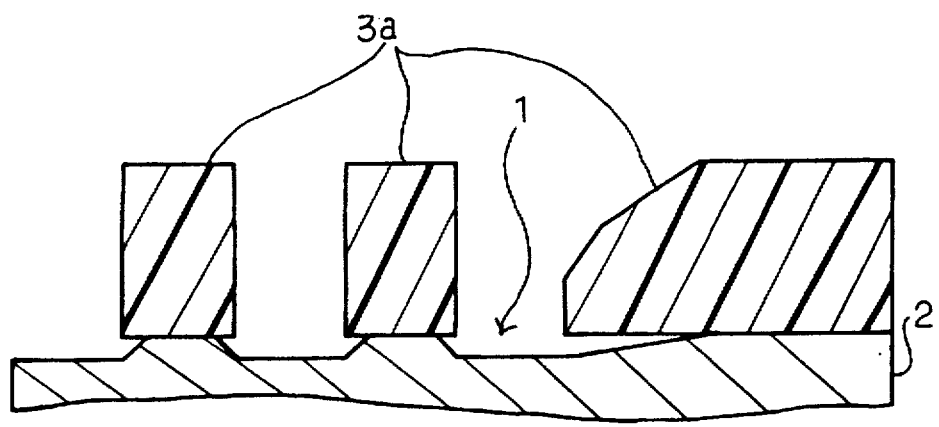
Figure 2A:
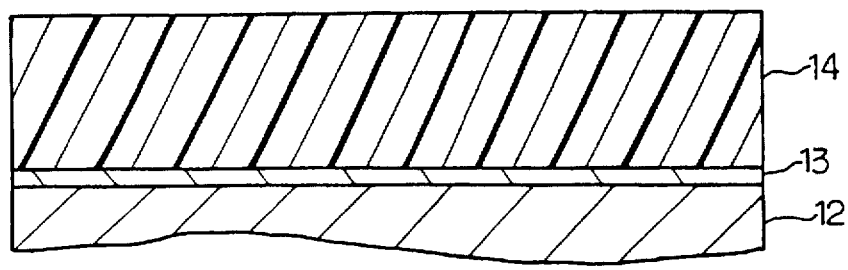
FIGS. 2A to 2F are cross sectional views showing the second prior art process sequence for forming the conductive pattern.
Figure 2B:
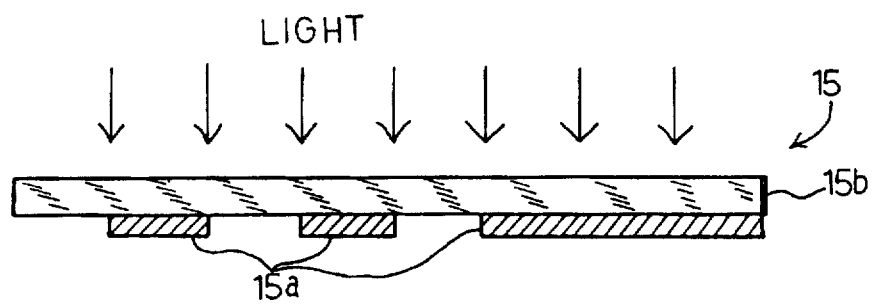
Figure 2C:
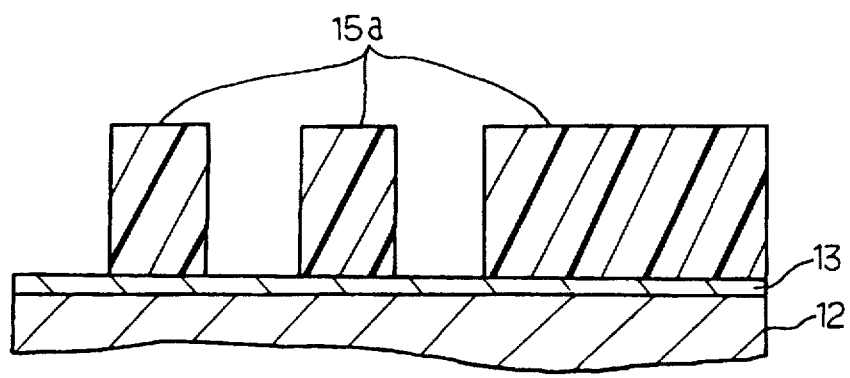
Figure 2D:
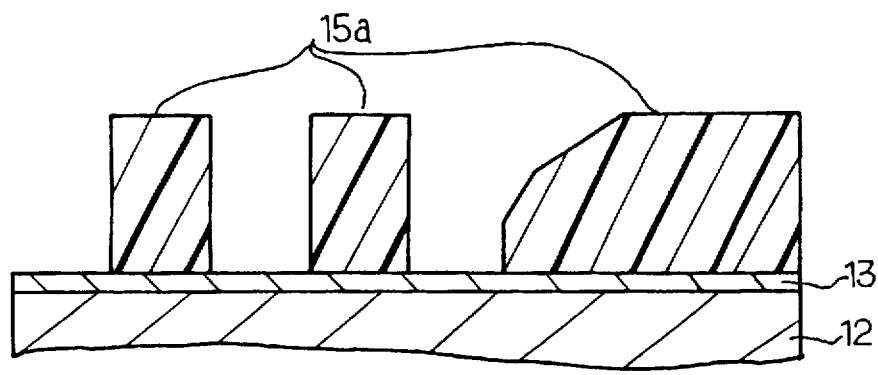
Figure 2E:
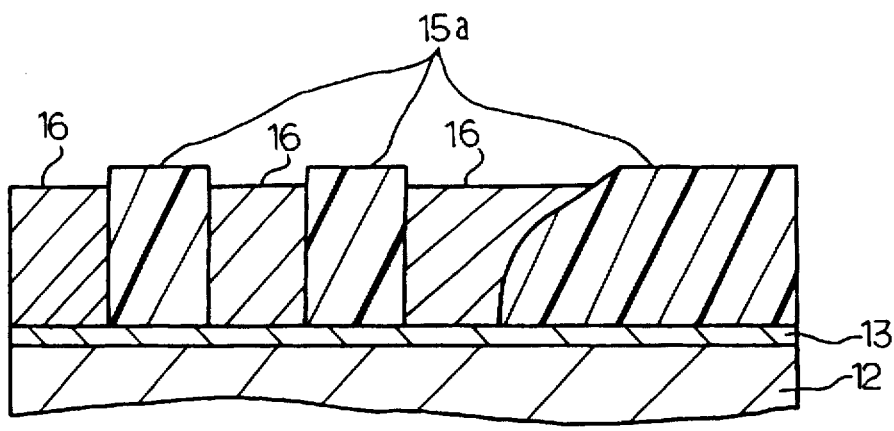
Figure 2F:
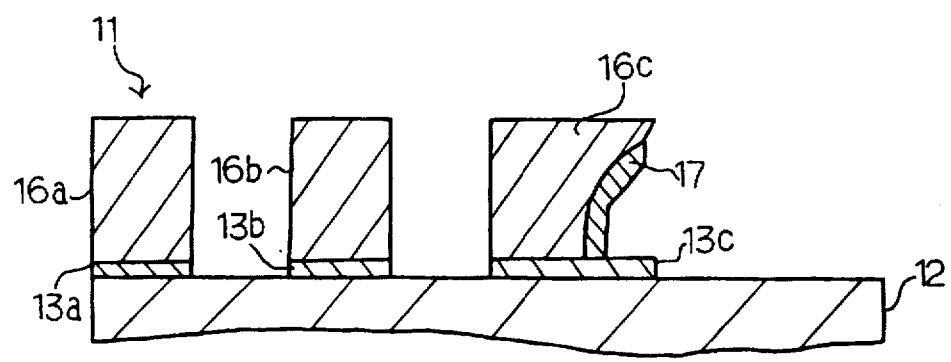
Figure 3A:
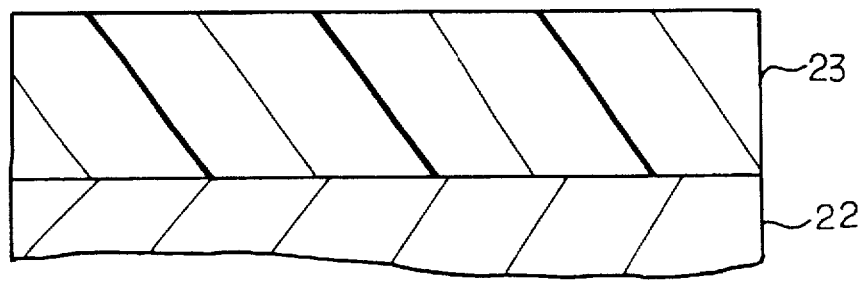
FIGS. 3A to 3F are cross sectional views showing a process sequence for forming a pattern in a semiconductor substrate according to the present invention.
Figure 3B:
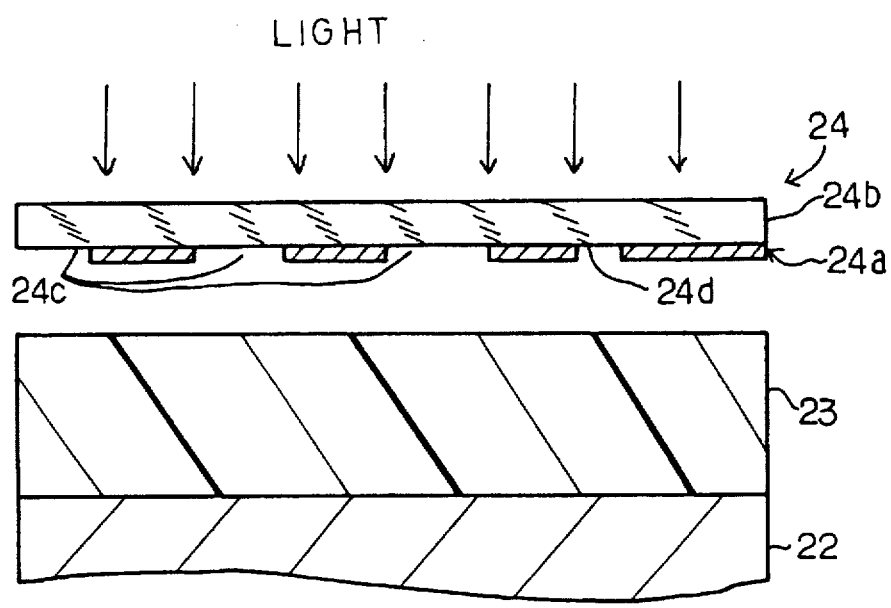

The process starts with preparation of the semiconductor substrate 22, and positive photo-resist solution is dropped on a surface of the semiconductor substrate 22, and is spread over the surface of the semiconductor substrate 22. The positive photo-resist thus spread over the surface is subjected to a pre-exposure bake, and the surface of the semiconductor substrate 22 is covered with a positive photo-resist layer 23 as shown in FIG. 3A.

The semiconductor substrate 22 is set in an aligner (not show), and a photo-mask 24 is moved into an optical path in the aligner. The photo-mask 24 has a non-transparent mask pattern 24a on the reverse surface of a transparent glass plate 24b. The non-transparent mask pattern 24a forms a main pattern image 24c and a dummy stress-relief pattern image 24d on the reverse surface of the transparent glass plate 24b.

Figure 4:
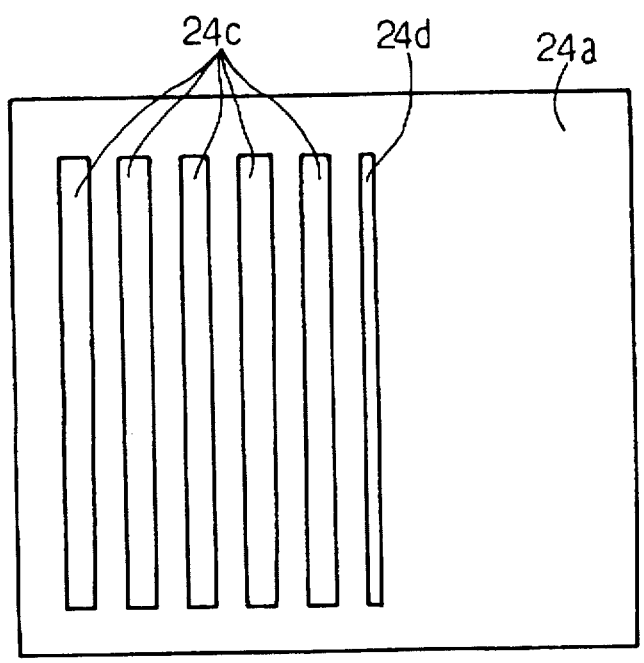
FIG. 4 is a bottom view showing main and dummy pattern images formed on the reverse surface of a photo-mask according to the present invention.

The main pattern image 24c is equivalent to a pattern of the grooves 21, and is implemented by a plurality of slits (see FIG. 4). The width of the slits is proportional to the width of the grooves 21. The dummy pattern image 24d is also implemented by a slit, and the slit is spaced from the rightmost slit of the main pattern image by a distance equal to or greater than the distance between the adjacent two slits of the main pattern image. If the main pattern image 24c and the dummy pattern image 24d are projected onto the surface of the semiconductor substrate 22, the slits of the main pattern image are spaced from one another by 1 micron, and the slit of the dummy pattern image is located within 5 microns spaced from the rightmost slit of the main pattern image 24c.

The slit of the dummy pattern image 24d is slightly narrower than the minimum line width at the limit of resolution achieved by the photo-resist process. The limit of resolution is defined as "limit where a width of an image on a resist is proportional to the width of the mask pattern". For example, if the limit of resolution is 0.4 microns by using i-ray of 365 nanometers wavelength, the width of the slit of the dummy pattern image is, by way of example reduced at 25 percent, and, accordingly, is 0.30 microns.

If another pattern image is formed on the reverse surface of the transparent glass plate 24b, it is spaced from the main pattern image 24c by a predetermined distance equivalent to 100 microns on the surface of the semiconductor substrate 22.

Referring back to FIG. 3B, light is radiated through the photo-mask 24 to the photo-resist layer 23, making the photo-resist layer 23 partially soluble, whereby the non-transparent mask pattern 24a is transferred onto the photo-resist layer 23.

Figure 3C:
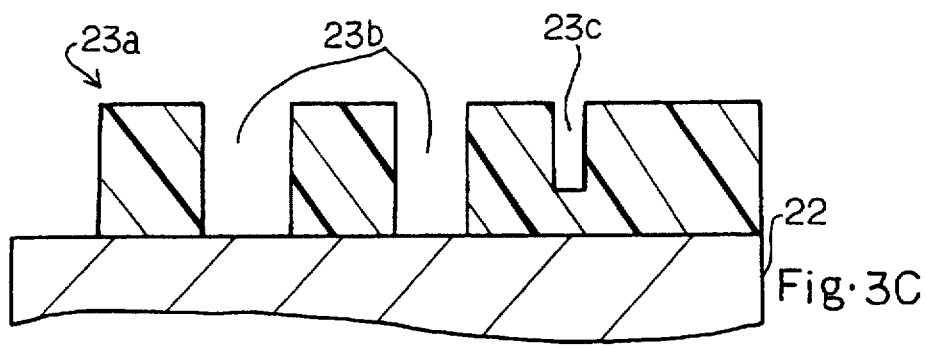

The photo-resist layer 23 is developed and then, dried. Then, a photo-resist mask 23a is formed from the photo-resist layer 23 as shown in FIG. 3C. The main pattern image 24c causes the photo-resist mask 23a to expose the semiconductor substrate 22 to slits 23b formed in the photo-resist layer 23, and the pattern of the slits 23b is similar to the main pattern image 24c. On the other hand, the dummy pattern image 24b forms a recess 23c, and the photo-resist still covers the semiconductor substrate 22 under the recess 23c. This is because of the fact that only the surface portion of the photo-resist layer 23 becomes soluble due to the lesser radiation through the dummy pattern image 24d.

Figure 3D:
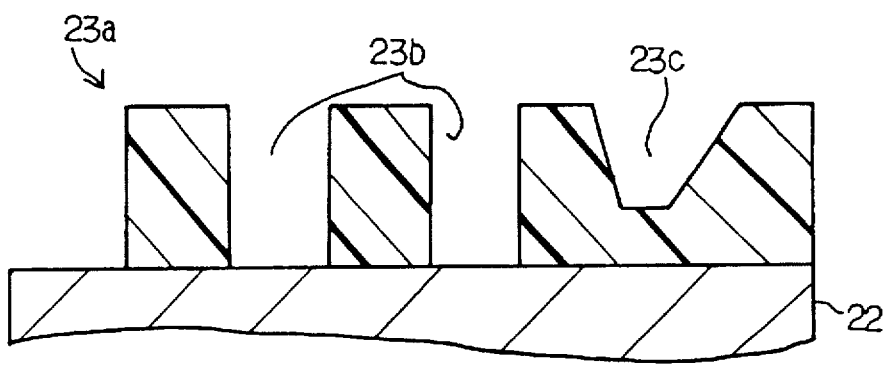
Figure 3E:
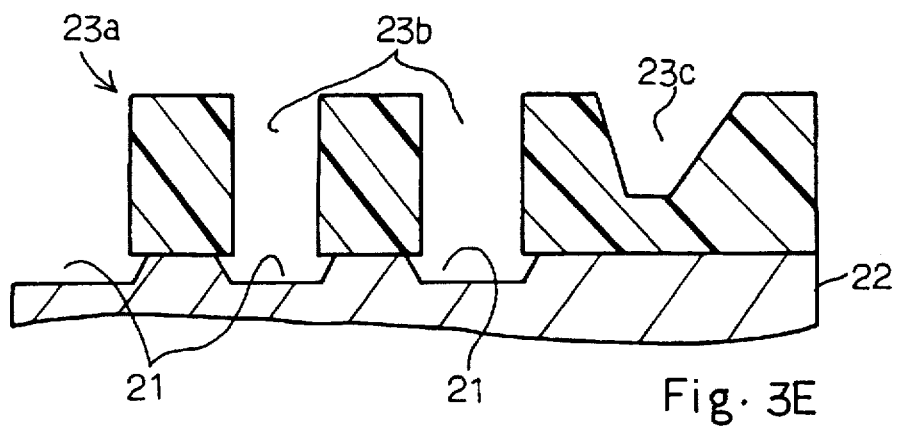
Figure 3F:
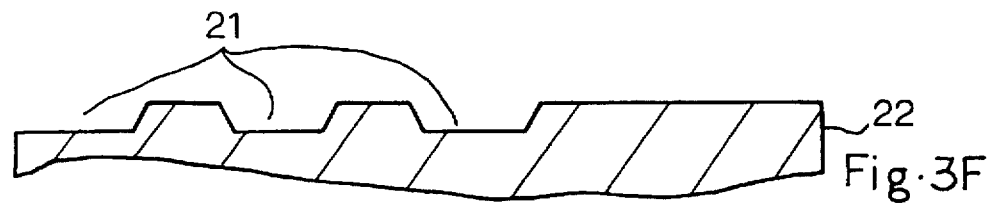

Subsequently, the photo-resist mask 3a is subjected to a post-development bake at 100 degrees centigrade in an oven or a hot plate, and the post-development bake enhances the adhesion between the photo-resist mask 23a and the semiconductor substrate 22. The photo-resist shrinks during the post-development bake, and tension takes place along the surface of the photo-resist mask 23a. The recess 23c takes up the tension, and the open end of the recess 23c is reamed as shown in FIG. 3D. The tension is not exerted on the surface forming a part of the rightmost slit 23b and the bottom surface adhered to the semiconductor substrate 22. As a result, the photo-resist mask 23a defining the photo-resist pattern is not deformed, and maintains the strong adhesion to the semiconductor substrate 22.

The semiconductor substrate 22 is then placed in a wet etching system, and an etchant isotropically removes the semiconductor substance exposed thereto as shown in FIG.

3E. As a result, the grooves 21 are formed in the surface portion of the semiconductor substrate 22. As described above, the adhesion between the photo-resist mask 23a and the semiconductor substrate 22 is large enough to withstand the wet etching, and the etching does not proceed to the portion beneath the photo-resist mask 23a.

The photo-resist mask 23a is stripped off from the semiconductor substrate 22, and the grooves 21 are proportional to the main pattern image 24c.

In the first embodiment, the main pattern image is implemented by the plurality of slits, and the dummy pattern image is formed by the slit adjacent to the main pattern image. However, the main pattern image may be formed by a rectangular open area 25a, and a frame-like open area 25b may form the dummy pattern image (see FIG. 5). The frame-like open area 25b is spaced from the rectangular open area 25a by a predetermined distance equivalent to 5 microns on a semiconductor substrate. The frame-like open area 25b is equal in width to the slit of the dummy pattern image 24d.

As will be understood from the foregoing description, the recess 23c takes up the tension due to the shrinkage in the post-development bake, and the strong adhesion between the photo-resist mask 23a and the semiconductor substrate 22 prevents the semiconductor substrate 22 from over-etching.

Second Embodiment

FIGS. 6A to 6F illustrate another process sequence according to the present invention, and the process is used for a conductive column pattern 31 rising from a semiconductor substrate 32.

Figure 6A:
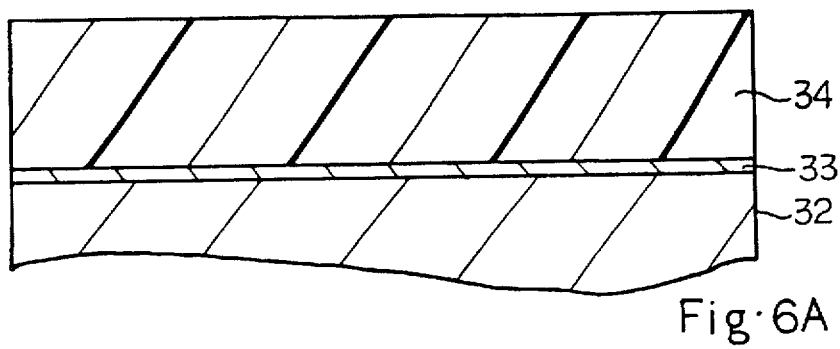
FIGS. 6A to 6F are cross sectional views showing another process sequence according to the present invention.

The process starts with preparation of the semiconductor substrate 32, and a platinum layer 33 is deposited to a 1000 angstrom thickness on a surface of the semiconductor substrate 32 by sputtering. Subsequently, positive photo-resist solution is dropped on a surface of the platinum layer 33, and is spread over the surface of the platinum layer 33. The positive photo-resist thus spread over the surface is subjected to a pre-exposure bake, and the surface of the semiconductor substrate 32 is covered with a positive photo-resist layer 34 of 2.5 micron thickness as shown in FIG. 6A.

The semiconductor substrate 32 is set in an aligner (not shown), and the photo-mask 24 is moved into an optical path in the aligner. The photo-mask 24 is described in conjunction with the first embodiment, and layers and images are labeled with the same references designating the corresponding layers and the images shown in FIG. 3B without repetition.

Figure 6B:
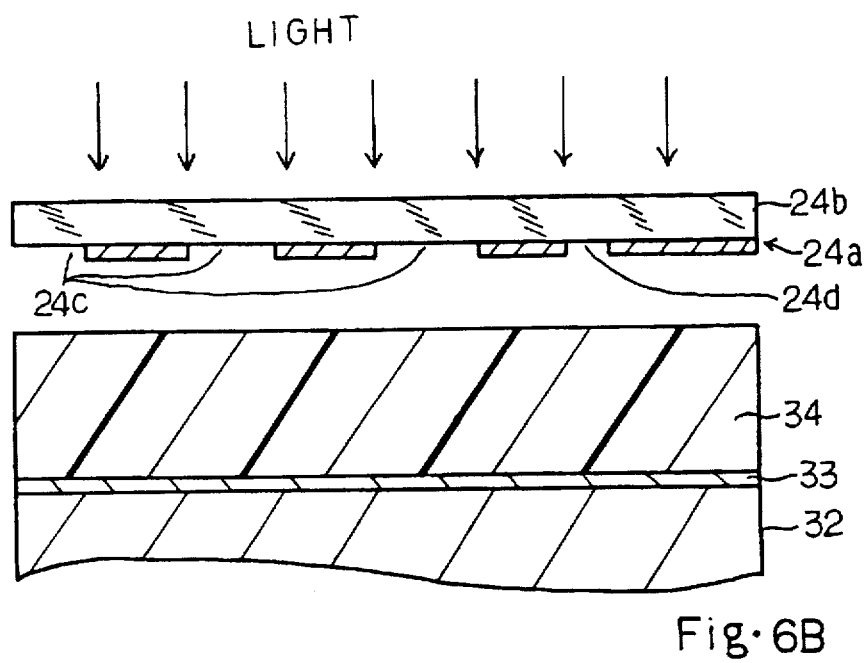

Light is radiated through the photo-mask 24 to the photo-resist layer 34 as shown in FIG. 6B, which makes the photo-resist layer 34 partially soluble, by which means the non-transparent mask pattern 24a is transferred onto the photo-resist layer 34.

Figure 6C:
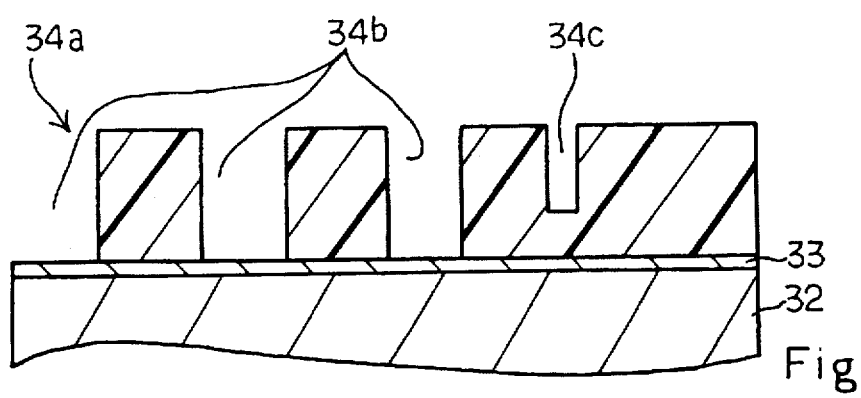

The photo-resist layer 34 is developed and is then, dried. A photo-resist mask 34a is formed from the photo-resist layer 34 as shown in FIG. 6C. The main pattern image 24c causes the photo-resist mask 34a to expose the platinum layer 33 to slits 34b formed in the photo-resist layer 34a, and the pattern of the slits 34b is similar to the main pattern image 24c. On the other hand, the dummy pattern image 24b forms a recess 34c, and the photo-resist still covers the platinum layer 33 under the recess 23c. This is because of the fact that only the surface portion of the photo-resist layer 34 becomes soluble due to the lesser radiation through the dummy pattern image 24d.

Figure 6D:
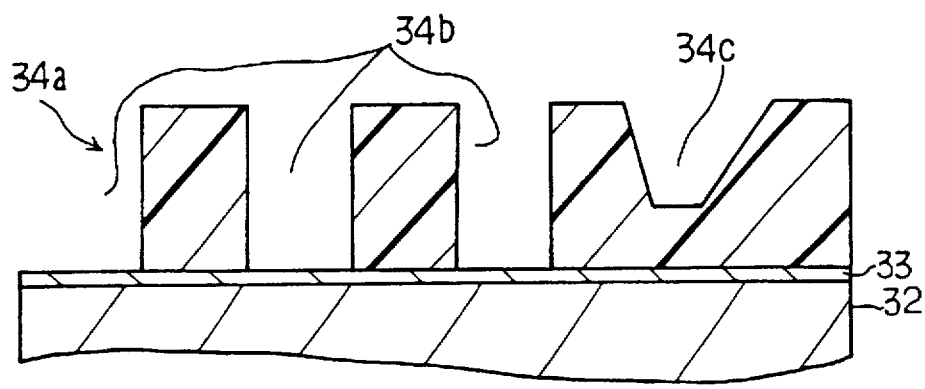

Subsequently, the photo-resist mask 34a is subjected to a post-development bake at 100 degrees centigrade in an oven or a hot plate so as to enhance the adhesion between the photo-resist mask 34a and the platinum layer 33. The photo-resist shrinks during the post-development bake, and tension takes place along the surface of the photo-resist mask 34a. The recess 34c takes up the tension, and the open end of the recess 34c is reamed as shown in FIG. 6D. The tension is not exerted on the surface forming a part of the rightmost slit 34b and the bottom surface adhered to the semiconductor substrate 32. As a result, the photo-resist mask 34a defining the photo-resist pattern is not deformed, and maintains the strong adhesion to the semiconductor substrate 32.

Figure 6E:
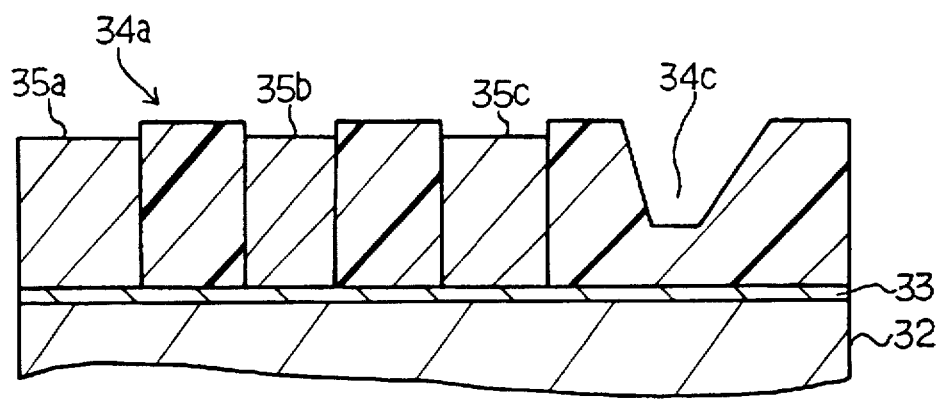

Using the photo-resist mask 15a, gold is deposited to a 2 micron thickness over the exposed surface of the platinum layer 33 through an electroplating, and gold columns 35a, 35b and 35c rise from the exposed surface of the platinum layer 33 as shown in FIG. 6E.

Figure 6F:
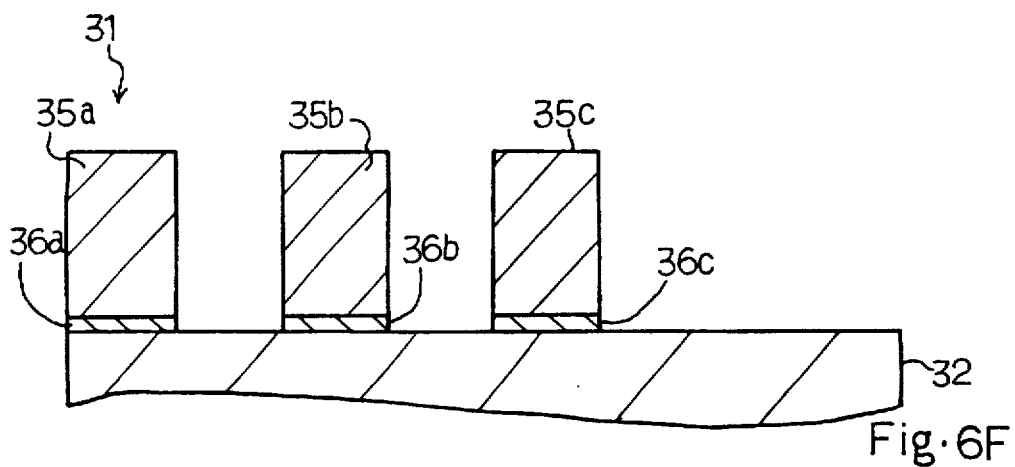

Subsequently, the photo-resist mask 34a is stripped off, and the platinum layer 33 and the gold columns 35a to 35c are subjected to an ion milling. The platinum layer 33 and the gold columns 35a to 35c are partially removed, and the gold columns 35a to 35c on the platinum strips 36a, 36b and 36c are electrically isolated from one another. The gold columns 35a to 35c and the platinum strips 36a to 36c as a whole constitute the conductive column pattern 31, and the semiconductor substrate 32 is exposed to the gaps among the platinum strips 36a to 36c as shown in FIG. 6F.

The columns of gold 35a to 35c are exactly proportional in width to the strips of the main pattern image 24c, and the process according to the present invention is available for a miniaturization of circuit components and wirings.

Figure 5:
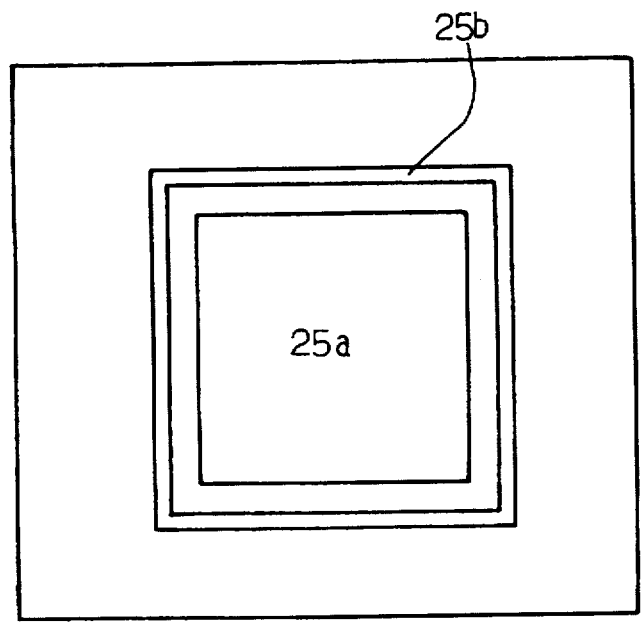
FIG. 5 is a bottom view showing main and dummy pattern images formed on the reverse surface of another photo-mask according to the present invention.

The photo-mask shown in FIG. 5 is available for the second embodiment.

As will be appreciated from the foregoing description, the dummy pattern image forms at least one recess in the photo-resist mask, and the at least one recess relieves the photo-resist mask from the tension due to the shrinkage in the post-development bake. The result is that the main pattern image is exactly transferred through the photo-resist mask to a base layer, and the base layer is prevented from an over-etching and the resultant overhung portion.

Although particular embodiments of the present invention have been shown and described, it will be obvious to those skilled in the art that various changes and modifications may be made without departing from the spirit and scope of the present invention.

For example, the present invention may be available for other lithography techniques such as an x-ray lithography and an ion-beam lithography.

Moreover, a pattern may be transferred to a thin semiconductor layer, an insulating layer or a metal layer.

In the above described embodiments, a positive photo-resist is used for the photo-resist masks. However, a photo-resist mask may be formed from a negative photo-resist layer.

What is claimed is:

1. A process for etching a given pattern in a first layer, comprising the steps of:

a) depositing a resist layer on said first layer;

b) transferring a mask pattern to said resist layer, said mask pattern having a main pattern image corresponding to said given pattern and a stress-relief pattern image corresponding to a stress-relief pattern comprising at least one recess to be formed in said resist layer;

c) developing said main pattern image and said stress-relief pattern image in said resist layer so as to form said resist layer into a resist mask having said at least one recess spaced from said first layer by a bottom portion of said photo-resist mask;

d) baking said resist mask so as to increase an adhesion; and e) etching said given pattern into said first layer by using said resist mask.

2. The process as set forth in claim 1, in which said step b) includes the sub-steps of:

b-1) covering said resist layer with a photo-mask having said mask pattern, and b-2) radiating light through said photo-mask to said resist layer so as to make said resist layer partially soluble in a developing solution, a first portion of said resist layer radiated through said main pattern image being soluble over a thickness of said resist layer, a second portion of said resist layer radiated through said stress-relief pattern being soluble to a depth less than said thickness.

3. The process as set forth in claim 2, in which said stress-relief pattern image has an open area transferring an amount of said light onto said resist layer insufficient to render the resist layer soluble over said thickness.

4. The process as set forth in claim 3, in which said open area is narrower than a limit of resolution capable of proportionally transferring an image.

5. The process as set forth in claim 1, in which said main pattern image has a plurality of first slits arranged in parallel at intervals, and said stress-relief pattern image has a second slit narrower than said plurality of first slit located in the vicinity of said plurality of first slits.

6. The process as set forth in claim 5, in which a distance between adjacent two of said plurality of first slits is equal to a distance between one of said plurality of first slits and said second slit.

7. The process as set forth in claim 1, in which said main pattern image has a rectangular open area, and said stress-relief pattern image has a frame-like open area provided outside of said rectangular open area.

8. A process of forming an etched pattern on a first layer, said etched pattern having a given configuration, comprising the steps of:

a) forming the first layer;

b) coating said layer with a photo-resist layer;

c) covering said photo-resist layer with a photo-mask, the photo-mask having a main pattern image corresponding to said given configuration, and having a stress-relief pattern image corresponding to a pattern of stress relief recesses to be formed on said photo-resist layer;

d) radiating a light through said photo-mask to said photo-resist layer so as to make a first portion of said photo-resist layer radiated through said main pattern image soluble, in a developing solution, over a thickness of said photo-resist layer, and a second portion of said photo-resist layer radiated through said stress-relief pattern image soluble to a depth less than said thickness;

e) developing said main pattern image and said stress-relief pattern image in said photo-resist layer so as to form said photo-resist layer into a photo-resist mask having an open area exposing a portion of said first layer in said first portion, and having at least one recess in said second portion, said recess spaced from said first layer by a bottom portion of said photo-resist mask;

f) baking said photo-resist mask so as to increase an adhesion between said first layer and said photo-resist mask; and g) etching the exposed portion of said first layer so as to form said pattern in said first layer to said given configuration.

9. A process of forming a layer to a given pattern, comprising the steps of:

a) forming a conductive layer on a substrate;

b) coating said conductive layer with a photo-resist layer;

c) covering said photo-resist layer with a photo-mask, the photo-mask having a main pattern image corresponding to said given configuration, and having a stress-relief pattern image corresponding to a pattern of stress relief recesses to be formed on said photo-resist layer;

d) radiating a light through said photo-mask to said photo-resist layer so as to make a first portion of said photo-resist layer radiated through said main pattern image soluble, in a developing solution, over a thickness of said photo-resist layer, and a second portion of said photo-resist layer radiated through said stress-relief pattern image soluble to a depth less than said thickness;

e) developing said main pattern image and said stress-relief pattern image in said photo-resist layer so as to form said photo-resist layer into a photo-resist mask having an open area located within said first portion exposing a part of said conductive layer, and having at least one recess located within said second portion, said recess spaced from said first layer by a bottom portion of said photo-resist mask;

f) baking said photo-resist mask so as to increase an adhesion between said conductive layer and said photo-resist mask;

g) depositing a substance on said part of said conductive layer so as to form at least one column of said substance;

h) removing said photo-resist mask; and l) forming said conductive layer to said given configuration by using said at least one column of said substance as a mask.

* * * * *